United States Patent [19]

Eden et al.

[11] 4,162,203

[45] Jul. 24, 1979

[54] METHOD OF MAKING A NARROW-BAND INVERTED HOMO-HETEROJUNCTION AVALANCHE PHOTODIODE

[75] Inventors: Richard C. Eden, Thousand Oaks; Kenichi Nakano, N. Hollywood, both of Calif.

[73] Assignee: The United States of America as represented by the Secretary of the Air Force, Washington, D.C.

[21] Appl. No.: 920,741

[22] Filed: Jun. 28, 1978

Related U.S. Application Data

[62] Division of Ser. No. 808,496, Jun. 21, 1977, Pat. No. 4,110,778.

[51] Int. Cl.² .......................................... H01L 31/18
[52] U.S. Cl. ................................. 204/38 R; 204/38 B; 204/192 D; 427/74; 427/85; 427/87; 29/572
[58] Field of Search ............... 204/38 R, 38 B, 192 D; 427/74, 85, 86, 87, 88, 82; 29/572; 357/13, 16, 30

[56] References Cited

U.S. PATENT DOCUMENTS

| | | | |
|---|---|---|---|
| 3,832,246 | 8/1974 | Lynch | 29/572 |
| 3,894,895 | 7/1975 | Khandelwal | 427/86 |
| 4,036,645 | 7/1977 | Pinder | 427/74 |

OTHER PUBLICATIONS

Silicon Nitride Films by Direct RF Sputter Deposition, G. J. Kominiak, J. Electrochem. Soc., Sep. 1975, pp. 1272-1273.

Primary Examiner—John H. Mack
Assistant Examiner—William Leader
Attorney, Agent, or Firm—Joseph E. Rusz; Casimer K. Salys

[57] ABSTRACT

A narrow-band, inverted homo-heterojunction avalanche photodiode, configured in the shape of a mesa situated upon a substrate which is transparent to selected light energy wavelengths. The diode is inverted for operation such that the incoming light energy enters the substrate side, passes through a wavelength selective buffer layer and is absorbed upon entering the succeeding, active region. Avalanche gain is attained by drift from the area of absorption to the high field p-n homo-heterojunction located immediately thereafter. The device exhibits low levels of noise during operation because absorption is occurring in a low field region and because the ionization and breakdown noise associated with lattice mismatches is avoided through the formation of the p-n homo-heterojunction in one continuous growth process. Appropriate passivation of the mesa walls inhibits surface leakage and breakdown effects.

2 Claims, 18 Drawing Figures

Fig-9
Fig-10
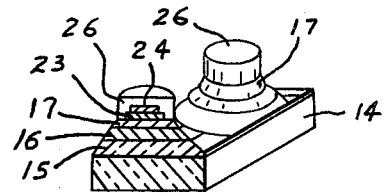
Fig-11
Fig-12
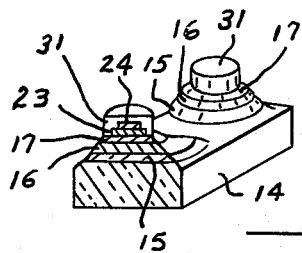
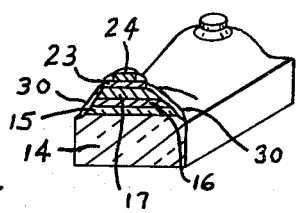
Fig-13
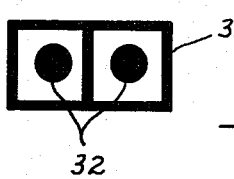
Fig-14
Fig-15
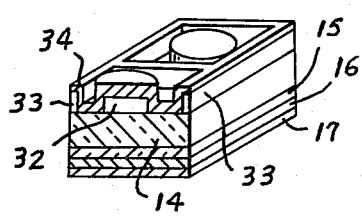
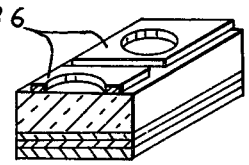
Fig-16
Fig-17
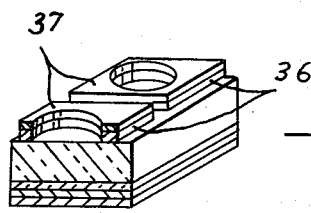
Fig-18
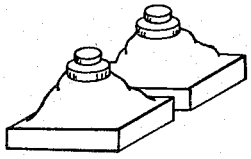

METHOD OF MAKING A NARROW-BAND INVERTED HOMO-HETEROJUNCTION AVALANCHE PHOTODIODE

RIGHTS OF THE GOVERNMENT

The invention described herein may be manufactured and used by or for the Government of the United States for all governmental purposes without the payment of any royalty.

This is a division, of application Ser. No. 808,496, filed June 21, 1977, now U.S. Pat. No. 4,10,778.

FIELD OF THE INVENTION

This invention relates to a type of semiconductor and to a method for fabricating such a device. More particularly, the invention relates to a class of devices generally known as avalanche photodiodes and to the growth, deposition and etching techniques used to fabricate such devices.

BACKGROUND OF THE INVENTION

The avalanche photodiode type light detector is used frequently as the sensor in optical receiver systems. With the ever increasing demand upon the performance of military detection and sensing systems, e.g., extended range laser trackers, there is a concomitant rise in the performance needed from the avalanche photodiode, in terms of sensitivity, frequency response, optical band filtering and signal-to-noise ratio.

The ultimate in receiver system performance is attained when a low noise amplification system is combined with a photodiode having extremely low capacitance, high quantum efficiency, low leakage, low series resistance and sufficient avalanche gain to raise the signal level above the noise of the preamplifier. In addition, the fabrication materials and configuration must be such that the detector exhibits these characteristics at the proper wavelength, and in most cases selectively excludes unwanted energy at other wavelengths.

The design and fabrication of general avalanche photodiodes is well known in the art, as is evidenced by the issuance of a number of patents encompassing this class of devices, such as U.S. Pat. Nos. 3,436,613 and 3,534,231. Though heterojunction avalanche photodiodes configured and fabricated as taught in the prior art are able to satisfy many of the performance goals, they are deficient in two aspects, the high frequency avalanche gain attainable and gain uniformity. These inadequacies occur because lattice mismatches and growth nucleation non-uniformities introduced into the junction area during the fabrication process lead to local areas of ionizable defects or reduced breakdown voltages.

BRIEF SUMMARY OF THE INVENTION

According to this invention, an avalanche photodiode is configured by controlled growth of multiple epitaxial layers upon an appropriate substrate. After contact deposition and etching of the layer side, a mesa shaped diode remains upon the substrate base.

This avalanche photodiode operates by having light energy enter the substrate side, which has been selected to be transparent to defined wavelengths; travel through a buffer layer, which has been doped to establish a short wavelength cutoff; and then enter a region where the principal wavelength is highly absorbed. The high field, high gain p-n junction is located immediately after the region of major absorption.

The appropriate use of doping materials in the various layers, and the formation of a p-n junction in one continuous growth process, produces an avalanche diode which is both wavelength selective in its response and exhibits a low noise factor. This performance is the result of a surface passivated mesa and well matched lattice structure at the p-n homo-heterojunction, allowing high field strengths at the junction. The close proximity of the p-n homo-heterojunction and the absorption region causes the light energy to be absorbed in a low field, low noise region and thereafter drift to the high field, high gain p-n junction.

It is an object of this invention to provide an improved avalanche photodiode configuration and a method for fabricating that configuration.

IN THE DRAWINGS

FIGS. 3 through 12 show the masks and effects of etching and deposition on the layer side of the wafer during the simultaneous fabrication of two avalanche photodiodes.

FIGS. 13 through 17 show the masks and the effects of etching and deposition on the substrate side of the wafer during the simultaneous fabrication of two avalanche photodiodes.

FIG. 18 shows the avalanche photodiodes in a completed form ready for mounting.

DETAILED DESCRIPTION OF THE INVENTION

Figure 1:
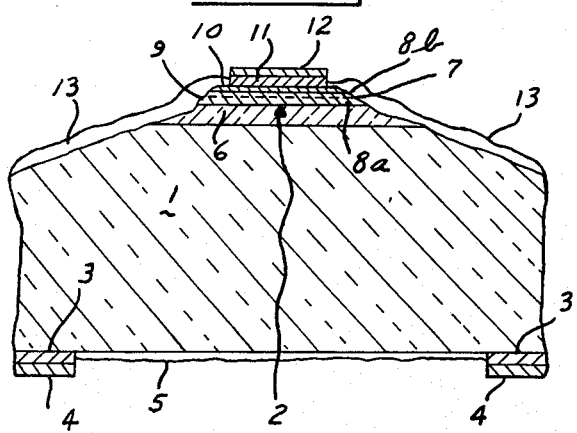
FIG. 1 is a cross sectional view illustrating an embodiment of the invention, showing the substrate and additional layers deposited thereupon in a mesa configuration.

In one embodiment, the present invention resides in the avalanche photodiode device whose configuration is shown in the cross sectional view of FIG. 1 of the drawings. Disclosed in FIG. 1 is a device wherein three epitaxial layers 6, 7 and 10 of doped GaAsSb alloys are grown on GaAs substrate 1 to form the structural wafer which is later etched to produce the mesa configuration. The GaAs substrate 1 is properly n+ doped to be transparent to incoming light energy 2 within the selected wavelength passband of 1.06 microns, but not so highly doped as to cause significant free carrier absorption. AuGe electrical contact 3 and Au contact protective layer 4 are bonded to the window side of the substrate, which is also provided with an anti-reflective coating 5 to reduce incoming energy reflective losses.

Upon passing through substrate 1, the light energy enters transparent n+ $GaAs_{1-y}Sb_y$ (y≈0.12) "buffer" layer 6, which serves to both reduce alloy lattice mismatches and define the short wavelength cutoff of the photodiode at about 1.04 microns. Grown thereon is an active (absorbing) region 8a, which together with region 8b forms the second layer 7 and contains the p-n homo-heterojunction 9. The second layer is comprised of n− $GaAs_{1-x}Sb_x$ (x≈0.17) region 8a and a p-type $GaAs_{1-x}Sb_x$ region 8b. The third layer 10 of p+ GaAsSb enhances lattice matching and forms the electrical interface between previous layer 7 and the AgIn contact pad 11. An Au protective layer 12 covers contact pad 11, and $Si_3N_4$ passivation layer 13 is deposited over the mesa walls to protect the junction region and to improve breakdown and surface leakage characteristics.

The use of appropriate surface passivation materials is essential to the homo-heterojunction configuration of the device illustrated in FIG. 1. In view of the high field concentration at the perimeter of junction 9 and adjacent region 8a, surface rather than bulk breakdown sets the bounds on the operational characteristics of the device by allowing breakdown before the center of the junction area produces significant avalanche gain. Use of $Si_3N_4$ surface passivation coating 13 induces a p-type surface channel on the outer surface of the $n^-$ $GaAs_{1-x}Sb_x$ in region 8a, effectively working in opposition to the geometrical field concentration to minimize surface breakdown effects.

In another embodiment, the present invention resides in a method for fabricating the homo-heterojunction avalanche photodiode. Broadly speaking, the method comprises two sequences of steps. First, the procedural steps to form wafer 20 shown in FIG. 2, by growing three epitaxial layers 15, 16 and 17 on substrate 14 are described. The second sequence of steps involves the deposition and etching associated with attaching electrical contacts and otherwise preparing the avalanche photodiode for actual use.

The wafer, consisting of three layers 15, 16 and 17 of a doped GaAsSb alloy grown upon doped GaAs substrate 14, is fabricated using the following sequence of steps. Substrate 14 is first prepared by a standard technique of mechanical lapping and polishing with successively finer grit alumina and finally a chemi-mechanical polish using Cabosil and $10H_2O:1H_2O_2$ in an oscillatory polisher. After removal the substrate is cleaned in trichloroethylene, acetone, water and methanol. The substrate is then etched in $3H_2SO_4:1H_2O_2:1H_2O$ just prior to insertion into a quartz furnace.

The alloy materials to be grown as layers 15, 16 and 17 upon the substrate 14 are likewise inserted into the furnace, but confined within a graphite box which has separate compartments for each of the various alloy layers to be grown. The substrate and alloy materials are raised to approximately 775° C., to reach their molten state, and then allowed to equilibrate for about one hour. The graphite box is brought over the substrate and the selected molten alloys allowed to contact the substrate through an opening in the box bottom. The starting temperature and time controlled cooling causes the alloy to grow into the substrate. This procedure is repeated in prescribed order for the subsequent layer alloys. Though affected to a degree by the specifics of the equipment used, the typical range for temperature and its rate of change, to obtain satisfactory layer growth, are 760° to 780° C. and 1 to 3 degrees per minute in cooling rate. Thereafter, the furnace is cooled to room temperature and the wafer removed for evaluation.

In the special case of junction layer 16, the doped molten alloy begins the layer growth process as an n-type alloy. Using the known relationship between growth rate and temperature, timely addition of p-type dopant to the molten layer alloy in the box determines the thickness of the n-type region and causes all subsequent growth to produce a p-type alloy. The result is a p-n junction within layer 16.

After removal, routine evaluation consists of cleaving along a <110> plane and etching for 2-3 seconds to delineate the junctions. The layer thicknesses are then measured under an optical microscope. Next, "quick diodes" are fabricated by etching a mesa with a wax dot on a portion of the wafer. Tungsten probes are contacted to the diode and a photo-response measurement is made. This measurement shows the bandgap of both the buffer 15 and active 16 layers and can be used as feedback on control of the epitaxial layer compositions.

To avoid Sb buildup and compositional changes during growth of the wafer, it is desirable to grow layers 15, 16, and 17 in a temperature region where the Sb mole fraction in the solid does not change rapidly with temperature. This condition is satisfied with a temperature of 750° C. or higher. An ancillary benefit accruing from the use of Sb in the layer alloys is associated with the tendency of GaSb to crystallize faster than GaAs as the temperature drops. This tendency coincides with the need for a higher proportion of Sb in layer 16 than in layer 15.

The critical step in the fabrication of the basic wafer occurs in the formation of the p-n homo-heterojunction during the growth of layer 16. Lattice mismatch and growth interruption defects normally present at a p-n junction are precluded by forming junction 9 within layer 7 (See FIG. 1). During growth the layer composition is held constant while the dopant introduced is changed from an n-type in region 8a to a p-type in region 8b. More specifically, active region 8a is started in the epitaxial growth process as $n^-$ with Sn dopant ($N_D \approx 1.5 \times 10^{15}$ cm$^{-3}$), but after about 3 to 5 microns of growth Ge p-type dopant is added in sufficient quantities to reverse the conductivity type within region 8b. The result is a grown p-n junction generally free of defects.

Two dopants are used in the wafer fabrication process. Sn as the n-type dopant and Ge as the p-type dopant. Both of these materials are particularly useful in this application, where more than one epitaxial region is grown at one time, because they both have low vapor pressures and thereby cause a minimum of cross contamination between melts.

Figure 2:
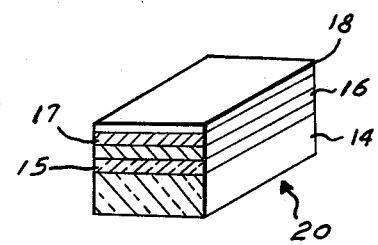
FIG. 2 is a pictorial view of a wafer with resist added to the layer side immediately prior to the processing to form a mesa configuration.

After the formation of wafer 20 as illustrated in FIG. 2, the second sequence of process steps is carried out using this wafer as the blank. Since the steps and materials used to process the layer side of the wafer composed of layers 15, 16 and 17 differ from those used to treat substrate 14 side, the individual descriptions are separated for clarity. As will be apparent from a consideration of the figures and the ensuing description, two avalanche photodiodes are being fabricated simultaneously from the same wafer.

Figure 4:
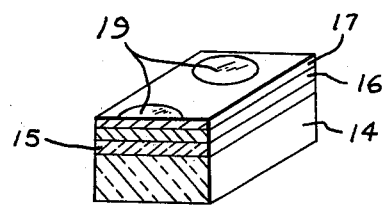
Figure 3:
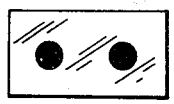
Figure 6:
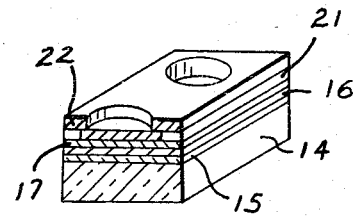
Figure 7:
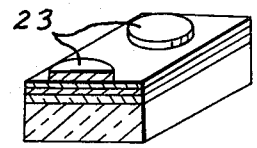

Treatment of the layer side proceeds as follows. Initially, resist layer 18 is applied over top layer 17 as shown in FIG. 2. As depicted in FIG. 4, resist layer 18 is photo etched lightly using the mask shown in FIG. 3 so as to leave circular patterns about 7 mils in diameter upon layer 17 for purposes of future alignment with substrate 14 side depositions. In forming the AgIn contacts, a resist layer 18 is again formed on the layer side of the wafer as shown in FIG. 2. Using the mask shown in FIG. 5, 5 mil holes are photo etched in the resist. An AgIn layer 22 is then vapor deposited over remaining resist layer 21 and in the etched holes, as shown in FIG. 6. The remaining resist layer 21 is now removed, thereby lifting off any AgIn covering that resist. As depicted in FIG. 7, the AgIn that remains constitutes contacts 23. Thereafter, AgIn contacts 23 are alloyed at 500° C. for one minute.

Figure 5:

To deposit Au protective layers 24 over contacts 23 as illustrated in FIG. 8, the resist is again applied and photo etched using the mask shape shown in FIG. 5 which is adapted to produce 4 mil circular holes over AgIn contacts 23. After one micron of Au is electroplated onto the top surface, the remaining resist and any covering Au are removed together, leaving Au layers 24 covering AgIn contacts 23.

Etching of the wafer's layer side to form the mesa structures is performed in two somewhat repetative steps. The shape of the mesas, in terms of their contour, is controlled by two factors, first, the depth to which the layers are etched away and, second, the diameter of the protective resist covering retained over the top of each mesa during the layer etching process.

Figure 8:
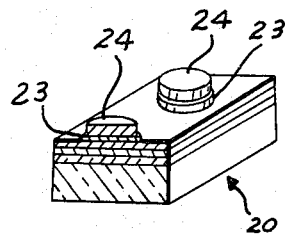

Beginning with the processed wafer shown in FIG. 8, the layer side is covered with resist, which is thereafter photo etched using the mask shown in FIG. 9. The mask is designed to leave two 7 mil diameter layers 26 of resist over the Au layers 24 and AgIn contacts 23. When the wafer layers are etched, the retained resist prevents removal of underlying materials, as shown in FIG. 10. The etching of the wafer layers must be carefully mointored and periodically measured to ensure that the first layer etch extends through layers 17 and 16, and into part of layer 15.

After cleaning, the layer side is again covered with resist and photo etched with the mask shape shown in FIG. 9. For this step the mask dimensions are selected to retain two 5.5 mil diameter regions 31 of resist materials over Au layers 24 and AgIn contacts 23. During this etch layer material removal is continued until the base of the mesa structure extends down into substrate 14, as illustrated in FIG. 11.

Passivation layer 30 of $Si_3N_4$ is then sputtered over the mesa walls to a depth of 2000 angstroms as shown in FIG. 12.

The substrate 14 side of wafer 20 in FIG. 2 is treated to reduce reflections at the optical windows and to attach electrical contacts. After the application of resist to the substrate side and photo etching with the mask shown in FIG. 13, a resist material layer remains having the shape of the hatched area of FIG. 13, specifically being two 15 mil diameter circular areas 32 within two 50 mil squares 33. Thereupon, a 1000 angstrom layer of AuGe contact material 34 is evaporated, as shown in FIG. 14. Upon removal of the remaining resist 32 and 33, AuGe layers 36 of the pattern shown in FIG. 15 remain. The AuGe is then alloyed at 500° C. for one minute. Resist is again applied and photo etched using the mask shown in FIG. 13. After electroplating a one micron layer of Au and removing the residual resist, the substrate side retains layers 37 of Au covering AuGe contacts 36 as depicted in FIG. 16. A $Si_3N_4$ anti-reflective coating is sputtered onto the substrate side to a depth of 1450 angstroms, and then removed from the top of Au layer 37 by scratching the substrate side on paper. The result is a $Si_3N_4$ deposit 38 covering only the optical entrance window as shown in FIG. 17.

FIG. 18 shows the avalanche photodiodes as completed devices after cleaving, in a form ready for mounting.

The principal advantage of the device structure shown in FIG. 1 over the prior art devices is that the peak electric field point, or highest avalanche gain region, occurs in an area of the grown epitaxial layer where there is neither any change in lattice constant nor any disturbance in the growth process from changing growth melts. In addition to relatively defect-free p-n junction 9, this structure has the added advantage of absorbing the light in a low field region 8a, between the junction 9 and buffer layer 6, and drifting through to the high gain region, somewhat like silicon "reach-through". The result is a lower noise factor for the inverted homo-heterojunction avalanche photodiode.

In the preparation of the structure depicted in FIG. 1, special care must be taken to avoid semiconductor problems. First, in the punch-through operation (i.e., where the depletion region extends all the way from p-n junction 9 through region 8a to buffer layer 6), the depletion width is established by the physical distance betwen p-n junction 9 and buffer layer 6. If there are local variations in the depletion thickness due to growth rate fluctuations over wafer region 8a, then for a given bias voltage there are corresponding fluctuations in electric field strength. Since avalanche gain is a very strong function of electric field strength, such non-uniformities can cause sizeable gain variations across the sensing face of the device. Second, with fully depleted operation there is a fairly high electric field (though not as high as at the p-n junction itself) in the region where buffer layer 6 meets region 8a, the active region of the next layer. This can lead to defect ionization problems.

With careful control during fabrication, both of these problem sources can be alleviated, for example, by altering the region 8a doping level or the distance from p-n junction 9 to buffer layer 6 so that the depletion region extends to a position of close proximity with layer 6. This requires some minority carrier diffusion to reach depletion region 8a, but if the thickness of the undepleted absorbing material is small enough ($\simeq 1$ micron) this does significantly degrade quantum efficiency or response time.

It is within the purview of the invention to construct an inverted homo-heterojunction avalanche photodiode of the configuration shown in FIG. 1 having a complimentary structure to the one disclosed in these embodiments, i.e., with all doping types reversed. Such a configuration exhibits higher and more uniform gains.

While the invention has been shown and described with reference to a particular set of embodiments thereof, it will be understood by those skilled in the art that various changes in form and materials may be made therein without departing from the spirit and scope of the invention.

We claim:

1. A method of fabricating an inverted avalanche photodiode upon a selectively transparent, doped semiconductor substrate of a first conductivity type comprising the steps of:
   a. growing a buffer layer of selectively transparent, doped semiconductor material, having a lattice structure matching said substrate and being of said first conductivity type;
   b. growing an active layer of selectively absorbent, doped semiconductor material having a lattice structure matching the buffer layer upon the buffer layer, where the grown material is of the same conductivity type as the buffer layer;
   c. adding opposite conductivity type dopant during the growth of the active layer in sufficient quantities to reverse the conductivity type of any subsequent growth, at a time when the active layer growth is only a few microns in thickness;
   d. growing a contact layer of doped semiconductor material having a lattice structure matching the active layer upon the active layer, with the conductivity type matching that of the immediately preceeding growth, to form a wafer consisting of a substrate with multiple layers deposited thereupon;
e. forming an electrical contact upon the contact layer;
f. masking and etching the side of the wafer upon which the layers are grown to form a mesa;
g. forming an electrical contact upon the substrate side of the wafer;
h. depositing passivation material, of a type which induces opposite conductivity type surface channels on the active layer grown in step b, upon all mesa surfaces etched during step e; and
i. depositing an anti-reflective coating material upon the substrate side of the wafer in the area where incoming light energy enters the substrate.

2. A method of fabricating a mesa-shaped inverted avalanche photodiode from an epitaxial multi-layer wafer, having a layer side including an active layer with regions of opposite conductivity types and a substrate side, comprising the following steps:
a. applying resist material to the layer side of the wafer;
b. photo etching the layer side resist so as to leave a centered circular hole therein;
c. evaporating electrical contact material over the layer side resist and hole;
d. removing the resist and any electrical contact material formed thereon;
e. alloying the remaining electrical contact material on the wafer at elevated temperature;
f. repeating step a;
g. repeating step b;
h. electroplating a layer of contact protective material over the layer side resist and hole;
i. removing the resist and any contact protective material formed thereon; j. repeating step a;
k. photo etching the layer side resist to retain an area of resist material completely covering the contact and contact protective materials;
l. etching the layer side of the wafer to form a-mesa shape;
m. applying resist to the substrate side of the wafer;
n. photo etching the substrate side resist to leave a resist layer in the shape of a circular area within a larger square perimeter area;
o. evaporating electrical contact material over the substrate side;
p. removing the resist and any electrical contact material formed thereon;
q. alloying the remaining electrical contact on the wafer at elevated temperature;
r. repeating step m;
s. repeating step n;
t. electroplating a layer of contact protective material over the substrate side resist and exposed contact material;
u. removing the resist and any contact protective material formed thereon;
v. sputtering passivation material upon all mesa surfaces etched during step l; and
w. applying an anti-reflective coating material upon the substrate side of the wafer in the circular area formed therein.

* * * * *